(12) United States Patent
Andreas et al.

(10) Patent No.: US 10,916,418 B2
(45) Date of Patent: *Feb. 9, 2021

(54) USING SACRIFICIAL POLYMER MATERIALS IN SEMICONDUCTOR PROCESSING

(71) Applicant: Micron Technology, Inc., Boise, ID (US)

(72) Inventors: Michael T. Andreas, Boise, ID (US); Jerome A. Imonigie, Boise, ID (US); Prashant Raghu, Boise, ID (US); Sanjeev Sapra, Boise, ID (US); Ian K. McDaniel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/676,881

(22) Filed: Nov. 7, 2019

(65) Prior Publication Data

US 2020/0075316 A1  Mar. 5, 2020

Related U.S. Application Data

(63) Continuation of application No. 15/904,777, filed on Feb. 26, 2018, now Pat. No. 10,497,558.

(51) Int. Cl.
*H01L 21/02* (2006.01)
*B81C 1/00* (2006.01)

(52) U.S. Cl.
CPC .... *H01L 21/02057* (2013.01); *B81C 1/00849* (2013.01); *H01L 21/02118* (2013.01); *H01L 21/02282* (2013.01); *H01L 21/02334* (2013.01); *B81C 2201/0108* (2013.01)

(58) Field of Classification Search
CPC .............. H01L 21/02; H01L 21/02057; H01L 21/02118; H01L 21/02282; H01L 21/02334; H01L 21/02101; H01L 21/028; H01L 21/445; H01L 21/288; H01L 21/2885; H01L 21/208; H01L 21/2085;
(Continued)

(56) References Cited

U.S. PATENT DOCUMENTS 7,749,909 B2  7/2010  Tomita et al.
8,617,993 B2  12/2013  Yasseri et al.
(Continued)

OTHER PUBLICATIONS

Buriak "Organometallic Chemistry on Silicon and Germanium Surfaces", Chemical Reviews, vol. 102, No. 5, Mar. 8, 2002, pp. 1271-1308.

(Continued)

*Primary Examiner* — Chuong A Luu
(74) *Attorney, Agent, or Firm* — Brooks, Cameron & Huebsch, PLLC (57) ABSTRACT

In an example, a wet cleaning process is performed to clean a structure having features and openings between the features while preventing drying of the structure. After performing the wet cleaning process, a polymer solution is deposited in the openings while continuing to prevent any drying of the structure. A sacrificial polymer material is formed in the openings from the polymer solution. The structure may be used in semiconductor devices, such as integrated circuits, memory devices, MEMS, among others.

20 Claims, 10 Drawing Sheets

(58) Field of Classification Search
CPC .......... H01L 21/0229; H01L 21/02307; H01L 21/02343; H01L 21/02623; H01L 21/02299; H01L 21/02315; H01L 21/02658; H01L 21/02661; H01L 21/0212; H01L 21/32056; B05D 1/00; B05D 1/62; B08B 3/00; B08B 3/14; C23C 14/02; C23C 14/028; C23C 14/021; C23C 14/022; C23C 16/02; C23C 16/029
USPC ....................................................... 438/758
See application file for complete search history.

(56) References Cited

U.S. PATENT DOCUMENTS

| | | |
|---|---|---|
| 9,653,307 B1 | 5/2017 | Imonigie et al. |
| 10,497,558 B2 * | 12/2019 | Andreas ............ H01L 21/02334 |
| 2011/0139083 A1 | 6/2011 | Krone et al. |
| 2011/0189858 A1 | 8/2011 | Yasseri et al. |
| 2013/0075823 A1 | 3/2013 | Yu |
| 2013/0081301 A1 | 4/2013 | Gouk et al. |
| 2015/0118821 A1 | 4/2015 | Millward et al. |
| 2015/0128991 A1 | 5/2015 | Brown et al. |
| 2016/0042945 A1 | 2/2016 | Limary et al. |
| 2017/0250094 A1 | 8/2017 | Verhaverbeke et al. |

OTHER PUBLICATIONS

Chen, et al. "Non-Stiction Performance of Various Post Wet-Clean Drying Schemes on High-Aspect-Ratio Device Structures", The Electrochemical Society, vol. 58, Issue 6, 2013, 1 pp.

\* cited by examiner

USING SACRIFICIAL POLYMER MATERIALS IN SEMICONDUCTOR PROCESSING

PRIORITY INFORMATION

This application is a Continuation of U.S. application Ser. No. 15/904,777, filed on Feb. 26, 2018, the contents of which are incorporated herein by reference.

TECHNICAL FIELD

The present disclosure relates generally to semiconductor processing, and, more particularly, to using sacrificial polymer materials in semiconductor processing.

BACKGROUND

Semiconductor processing (e.g., fabrication) can be used to form semiconductor devices, such as integrated circuits, memory devices, microelectromechanical devices (MEMS), etc.

Examples of memory devices that can be formed by semiconductor processing include, but are not limited to, volatile memory (e.g., that can require power to maintain its data), such as random-access memory (RAM), dynamic random access memory (DRAM), synchronous dynamic random access memory (SDRAM), among others, and non-volatile memory (e.g., that can provide persistent data by retaining stored data when not powered), such as NAND flash memory, NOR flash memory, read only memory (ROM), electrically erasable programmable ROM (EEPROM), erasable programmable ROM (EPROM, among others.

Semiconductor processing can involve forming features (e.g., patterns) on and/or in a substrate, such as a semiconductor substrate (e.g., of silicon), that may be referred to as a wafer. In some examples, one or more materials, such as silicon-based materials (e.g., silicon oxide (SiO), silicon nitride (SiN), tetraethyl orthosilicate (TEOS), and/or polysilicon), conductors, etc. may be formed on the semiconductor. For instance, a deposition process, such as physical vapor deposition (PVD), chemical vapor deposition (CVD), atomic layer deposition (ALD), electrochemical deposition and/or molecular beam epitaxy, among others may be used to form the materials on the semiconductor.

Subsequently, portions of the one or more materials, and in some instances, portions of the semiconductor, may be removed, such as by wet and/or dry etching, to form the features. In some examples, the features may have high aspect ratios (e.g., ratios of height to width or diameter) and may be referred to as high-aspect-ratio (HAR) features. For example, the features might be separated from each other by HAR openings.

During processing, the substrate and the features may be subjected to wet processing, such as wet cleaning, and subsequent drying. For example, wet cleaning can be helpful to remove residue left behind, such as by the removal process or other processing.

DETAILED DESCRIPTION

The present disclosure includes processing methods, such as semiconductor processing methods, associated with forming semiconductor devices, such as integrated circuits, memory devices, MEMS, among others. For example, one such method may perform a wet cleaning process to clean a structure having features and openings between the features while preventing drying of the structure. After performing the wet cleaning process, the method may deposit a polymer solution in the openings while continuing to prevent any drying of the structure. The method may then form a sacrificial polymer material in the openings from the polymer solution. The structure may be used in semiconductor devices, such as integrated circuits, memory devices, MEMS, among others.

Figure 1:
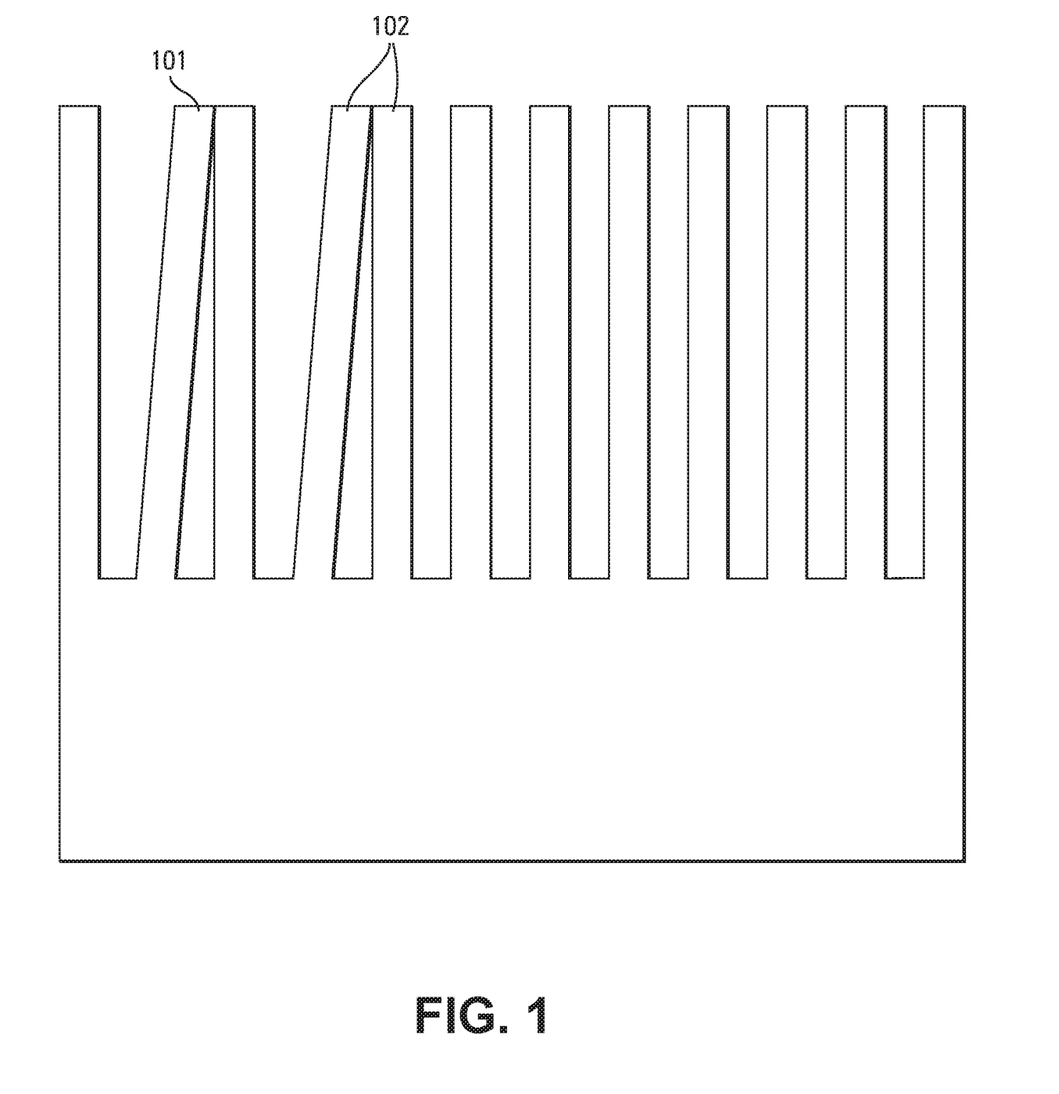
FIG. 1 presents various examples of feature toppling.

Embodiments of the present disclosure provide technical advantages, such as reducing the likelihood of feature toppling (e.g. collapse) during processing, compared to previous approaches. For example, in some previous approaches, capillary forces in the openings, resulting from drying the features after wet cleaning, can cause the features to topple (e.g., collapse) into each other. For example, FIG. 1 illustrates a feature 101 toppling into an adjacent feature and a pair of adjacent features 102 toppling into each other (e.g. in what is sometimes referred to as bridging) because of such capillary forces. This can lead to defects in the semiconductor device, and can even render the semiconductor device inoperable.

The embodiments disclosed herein solve the problem of feature toppling, resulting from drying occurring after wet cleaning. After wet cleaning, the features and the structure in which the features are formed are maintained in a fully (e.g., completely) wet state and a polymer solution is deposited in the openings between the features while preventing any drying from occurring. Subsequently, the polymer solution is baked to form a sacrificial polymer in the openings. This process prevents drying from occurring in the openings that can lead to feature toppling.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

Figure 2:
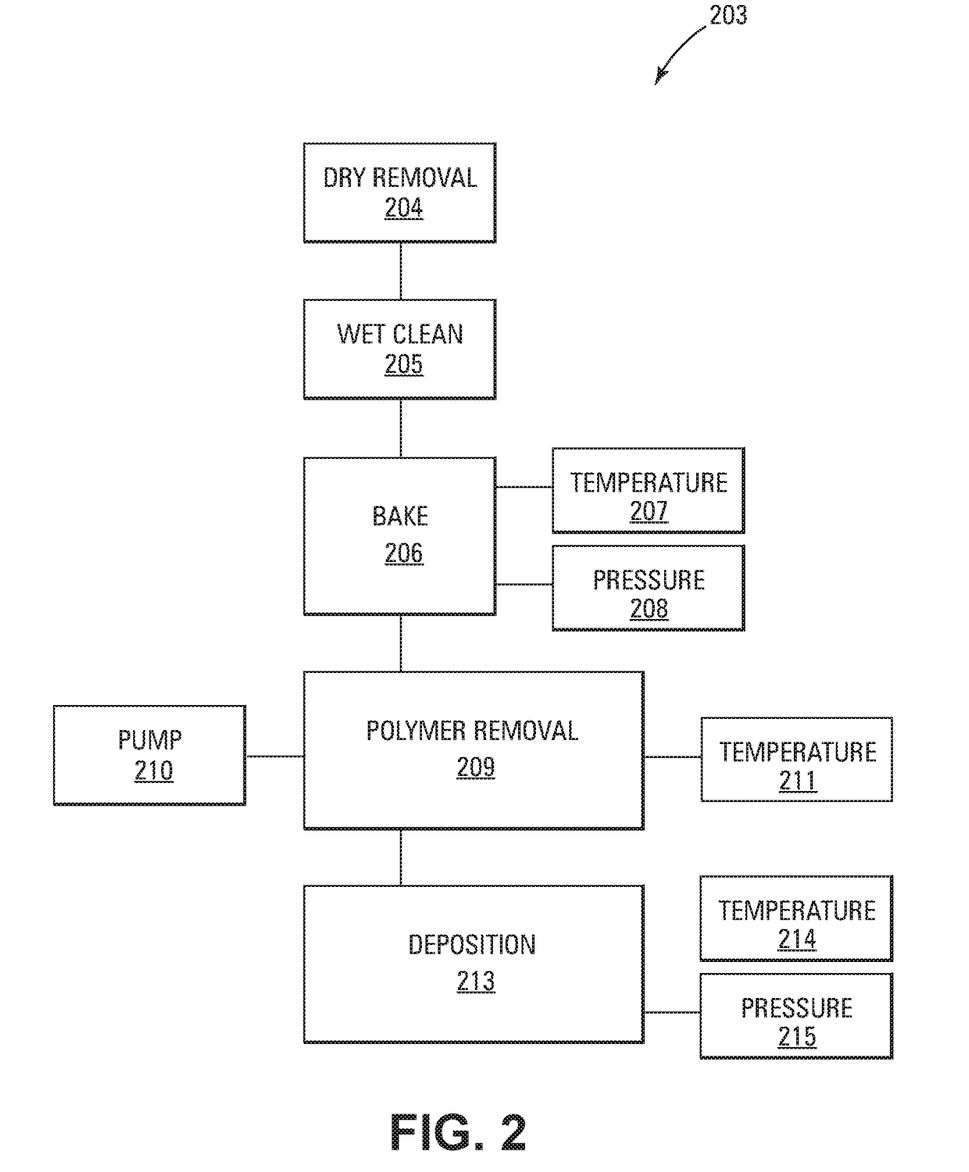
FIG. 2 is a block diagram illustration of a processing apparatus used in conjunction with the processing steps associated with forming a semiconductor device, in accordance with a number of embodiments of the present disclosure.

FIG. 2 is a block diagram illustration of a processing apparatus 203, such as a semiconductor processing apparatus, that can be used in conjunction with the processing steps associated with forming a semiconductor device, in accordance with a number of embodiments of the present disclosure. Apparatus 203 includes a dry-removal component 204, such as a dry-removal chamber (e.g., a dry-etch tool), that can be used to form features. Apparatus 203 includes a wet cleaning component 205, such as a wet cleaning chamber (e.g., a wet cleaning tool), that can be used to perform wet cleaning operations to remove residues resulting from forming the features using dry-removal component 204. In some examples, a polymer solution may be deposited at wet cleaning component 205 after performing wet cleaning operations, in accordance with a number of embodiments of the present disclosure.

Apparatus 203 includes a baking component 206, such as a baking chamber, that can be used to bake the polymer solution to form a sacrificial polymer material, in accordance with a number of embodiments of the present disclosure. In some examples, baking component 206 and wet cleaning component 205 may be in different chambers of apparatus 203. Baking component 206 and wet cleaning component 205 may be in different tools or part of the same tool.

A temperature controller 207 can be used to set and control the temperature of baking component 206. For example, temperature controller 207 can be used to set the baking temperature at which the polymer solution is baked. A pressure controller 208 can be used to set and control the pressure of baking component 206.

Apparatus 203 includes a polymer-removal component 209, such as a polymer-removal chamber (e.g., a polymer-removal tool), that can be used to remove the sacrificial polymer material, in accordance with a number of embodiments of the present disclosure. For example, polymer-removal component 209 may use plasma process, such as plasma ashing (e.g., plasma stripping) to remove the sacrificial polymer. A pump 210, such as a vacuum pump, may be used to increase or decrease the pressure in the polymer removal component 209 in which the removal process may be performed and, for example, for removing ash that may be formed during the removal process. A temperature controller 211 can be used to set and control the temperature of polymer-removal component 209. For example, temperature controller 211 can be used to set the temperature at which the sacrificial polymer material is removed. For example, the temperature of the sacrificial polymer material may be allowed equilibrate to the temperature of polymer-removal component 209 before the sacrificial polymer material is removed, so that the sacrificial polymer material can be removed while at that temperature.

Apparatus 203 includes a deposition component 213, such as a deposition chamber (e.g., a deposition tool), that can be used to deposit materials after the sacrificial polymer material is removed. A temperature controller 214 can be used to set and control the temperature of deposition component 213. A pressure controller 215 can be used to set and control the pressure of deposition component 213.

FIGS. 3A-3G illustrate cross-sectional views of processing steps, such as of a semiconductor processing method, associated with forming a semiconductor device, such as a portion of an integrated circuit, a memory device, a MEMS, among others, in accordance with a number of embodiments of the present disclosure. For example, the processing steps may be associated with forming (e.g., a memory array of) a DRAM memory device, a NAND flash memory device, a NOR flash memory device, capacitors, among others.

Figure 3A:
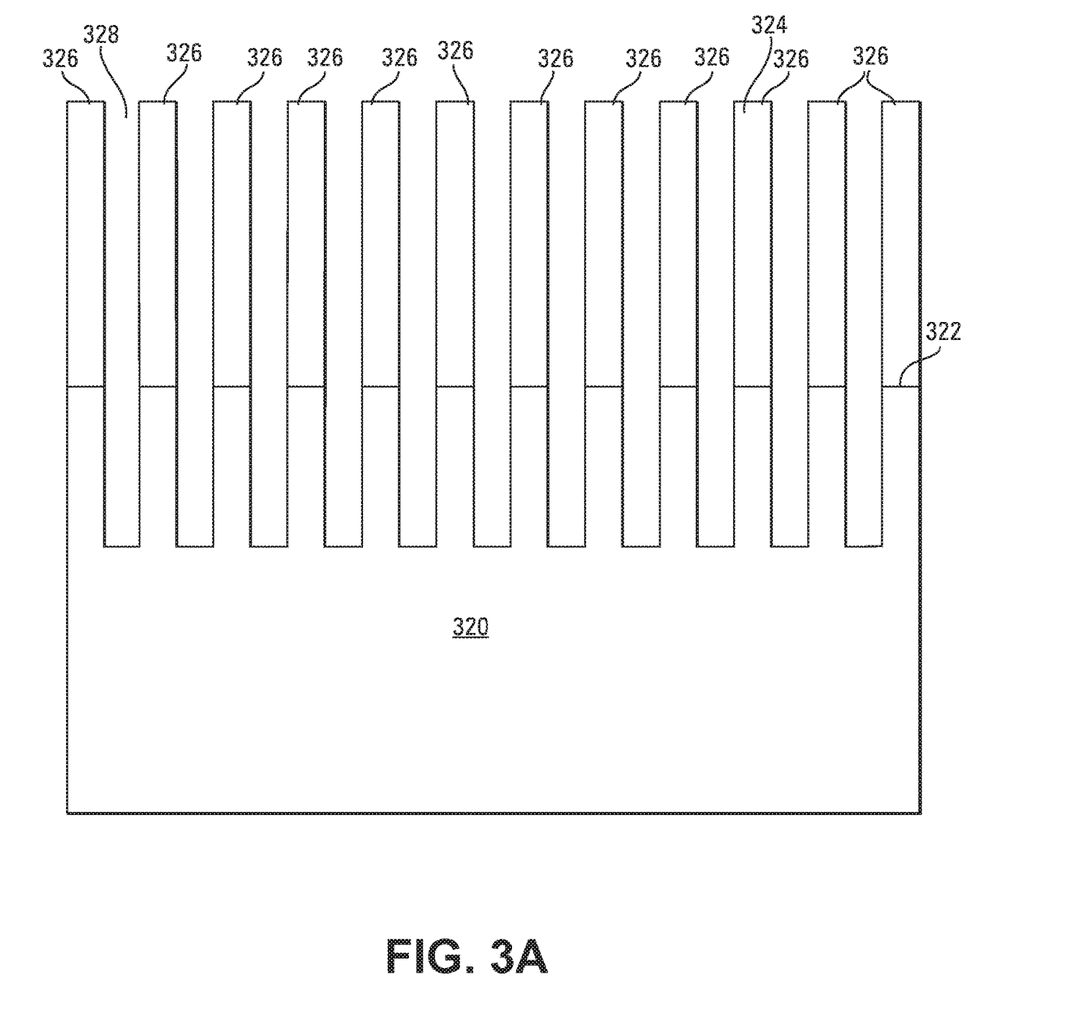
FIGS. 3A-3G illustrate cross-sectional views of processing steps associated with forming a semiconductor device, in accordance with a number of embodiments of the present disclosure.

FIG. 3A depicts a structure (e.g., to be used in a semiconductor device) after several processing steps have occurred. The structure may include a base structure, such as a substrate 320 (e.g., a semiconductor). In some examples, one or more materials 324, such as silicon-based materials, conductive materials (e.g., metals), among others, may be formed on (e.g., over) a surface 322, such as an upper surface, of substrate 320, using, for example, a deposition process, such as PVD, CVD, ALD, electrochemical deposition and/or molecular beam epitaxy, among others.

Features 326, such as nanofeatures (e.g., having a width or diameter of about 0.1 nanometer to about 100 nanometers) are formed by removing portions of the structure, such as portions of the one or more materials 324 and portions of substrate 320. The removal process forms openings 328, such as spaces (e.g., trenches), through the one or more materials 324, stopping above, on, or in (e.g., as shown in FIG. 3A) substrate 320. For example, an opening 328 may be between adjacent features 326. In some examples, each of the respective features 326 includes the one or more materials 324 and a portion of substrate 320.

In some examples, portions of the openings 328 in substrate 320 (e.g., below surface 322) may correspond to isolation regions, such as shallow trench isolation (STI) regions. In an example, a feature 326 may be entirely substrate 320, and openings 328 may correspond to STI regions. In another example, features 326 include a conductive material, such as a metal, conductively doped silicon, among others. For example, features 326 may be access lines, such as word lines, data lines, such as bit lines, in a memory array, or capacitor plates, among others. In some examples, features 326 may be memory cells, such as non-volatile memory cells, and may include a tunnel dielectric on surface 322, a charge storage structure, such as a charge trapping structure, a floating gate, or the like, on the tunnel dielectric, and a control gate (e.g., that may be coupled to or form a portion of an access line) on the charge storage structure. Features 326 may be HAR features, and openings 328 may be HAR openings. For example, a HAR may have an aspect ratio of greater than 10 to 1.

In some examples, openings 328, and thus the structure in FIG. 3A, may be formed using a dry removal process, such as a dry etch. A mask (not shown), such as imaging resist (e.g., photo-resist), may be formed over the one or more materials 324 and patterned to expose regions of the one or more materials 324. The exposed regions may be subsequently removed, such as by the dry etch process, to form openings 328 that may terminate on or in substrate 320.

After the dry processing, a wet cleaning process may be performed on the structure of 3A to remove residues that can form on exposed surfaces of substrate 320 and features 326, such as in openings 328. For example, the wet cleaning process may be performed while maintaining the entire structure in FIG. 3A in a fully wet state, without allowing any drying of the structure to occur (e.g., while preventing any drying of the structure). For example, the various liquids applied during the wet clean may be applied continuously with no stopping so as to avoid any drying.

In some examples, the wet cleaning process may include an aqueous wet clean that may include hydrofluoric acid (HF). In an example, an aqueous wet clean may include a standard clean-1 (SC-1) that may include deionized (DI) water, aqueous ammonium hydroxide, and aqueous hydrogen peroxide. For example, the standard clean-1 may be performed before and after applying the HF. In some instances, a standard clean-2 (SC-2) that may include deionized (DI) water, aqueous hydrochloric acid, and aqueous hydrogen peroxide may be performed after the standard clean-1 as part of the aqueous wet clean. The wet cleaning process may further include the aqueous wet clean followed by a liquid DI water rinse.

Figure 3B:
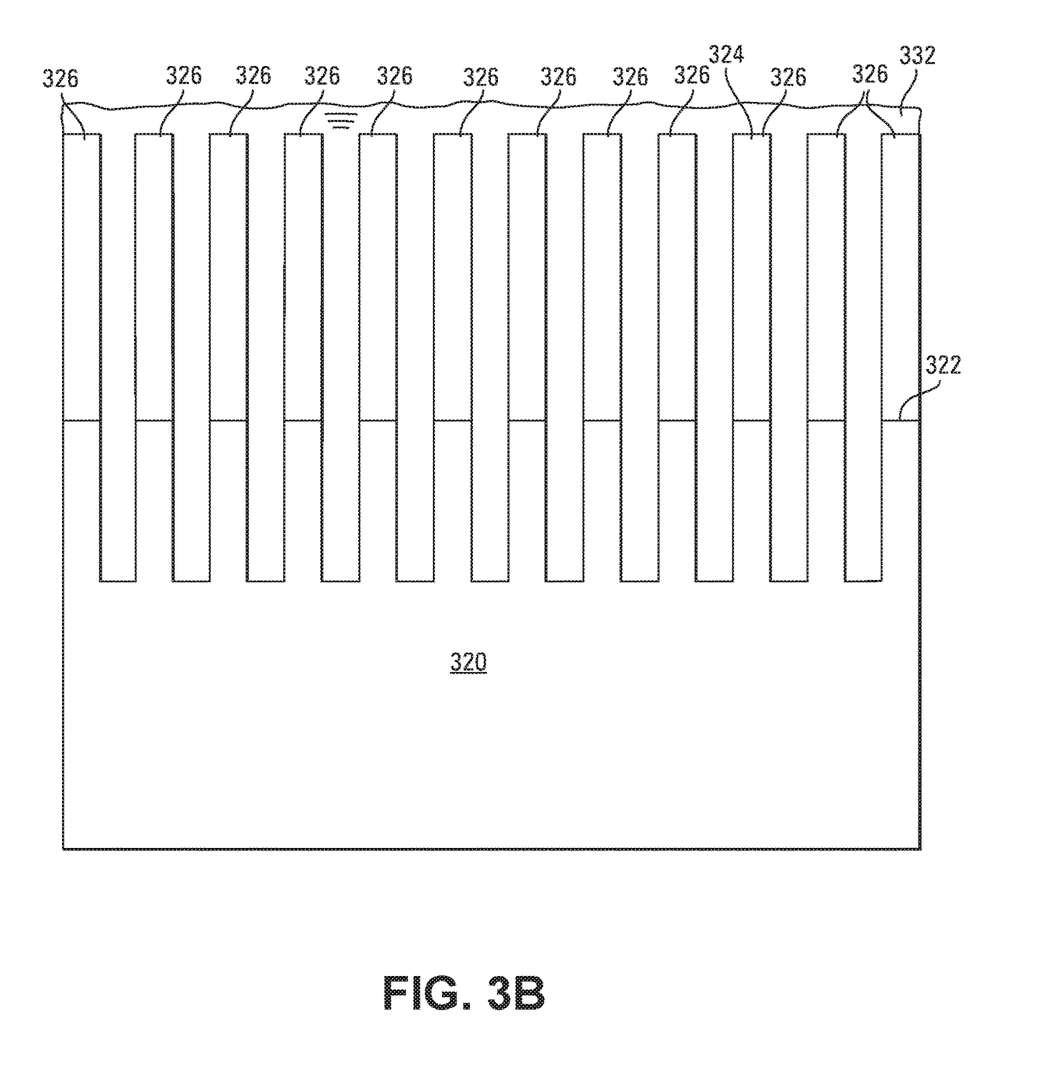

FIG. 3B illustrates a DI rinse in which the structure of FIG. 3A is fully wetted with DI water 332 and openings 328 are overfilled with liquid DI water 332. For example, the structure is completely covered with DI water 332 in FIG. 3B. In some examples, the various components (e.g., liquids) of the wet cleaning process may be spin coated onto the structure while the structure is spinning.

Figure 3C:
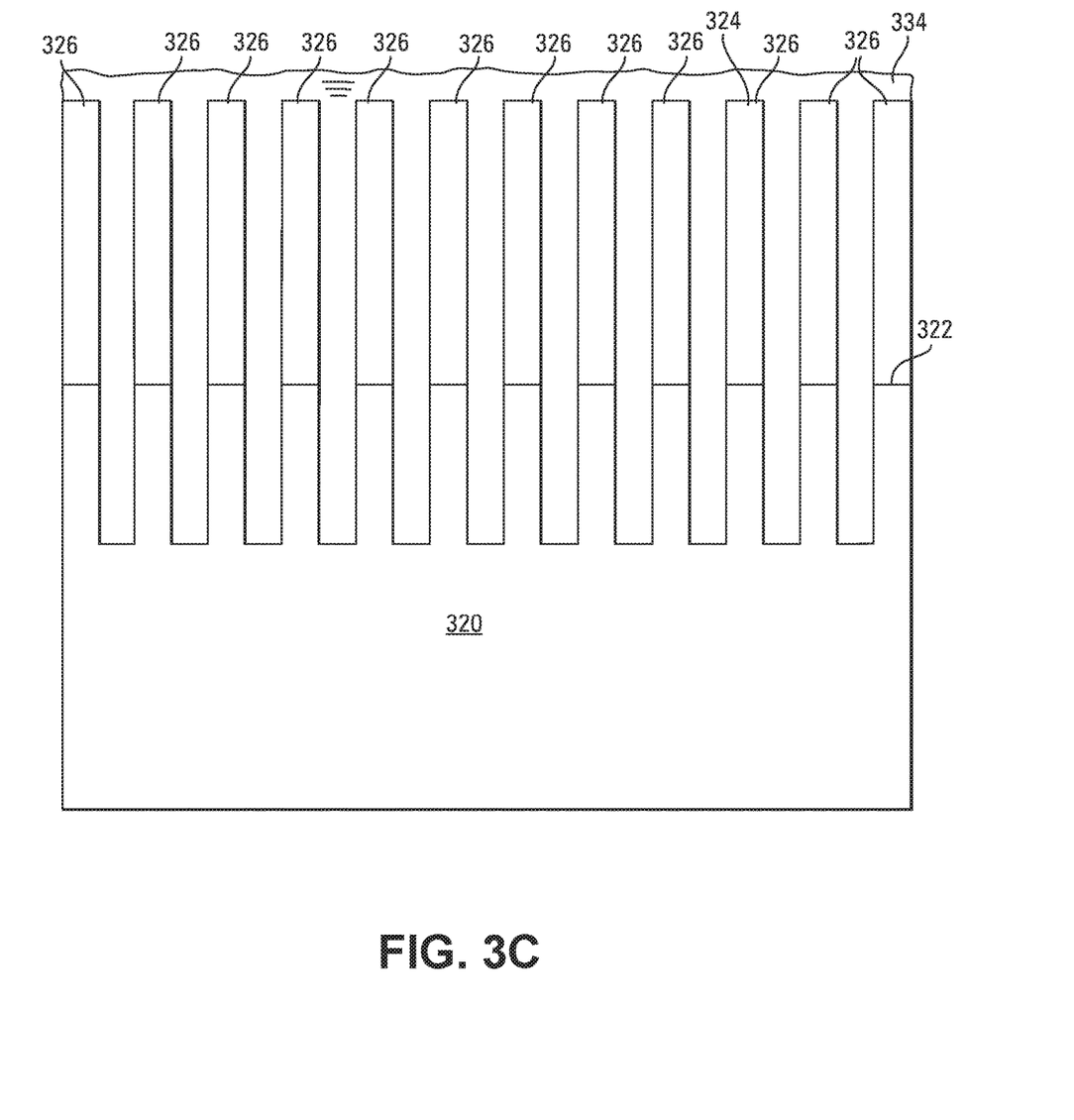

In FIG. 3C, DI water 332 in FIG. 3B is completely displaced by a liquid solvent 334. For example, solvent 334 may be deposited in openings 328 so that openings are overfilled with solvent 334 while preventing any drying of the structure from occurring, such as while maintaining the structure in a fully wetted state. For example, the transition between depositing DI water 332 and solvent 334 may occur continuously without any breaks between the flow of DI water 332 and the flow of solvent 334 so as to avoid any drying, and thus avoiding any drying-induced toppling of features 326. For example, solvent 334 may be spin coated onto the structure while the structure is spinning. In some examples, solvent 334 may be isopropanol, acetone, methanol, cyclohexanone, among others.

Figure 3D:
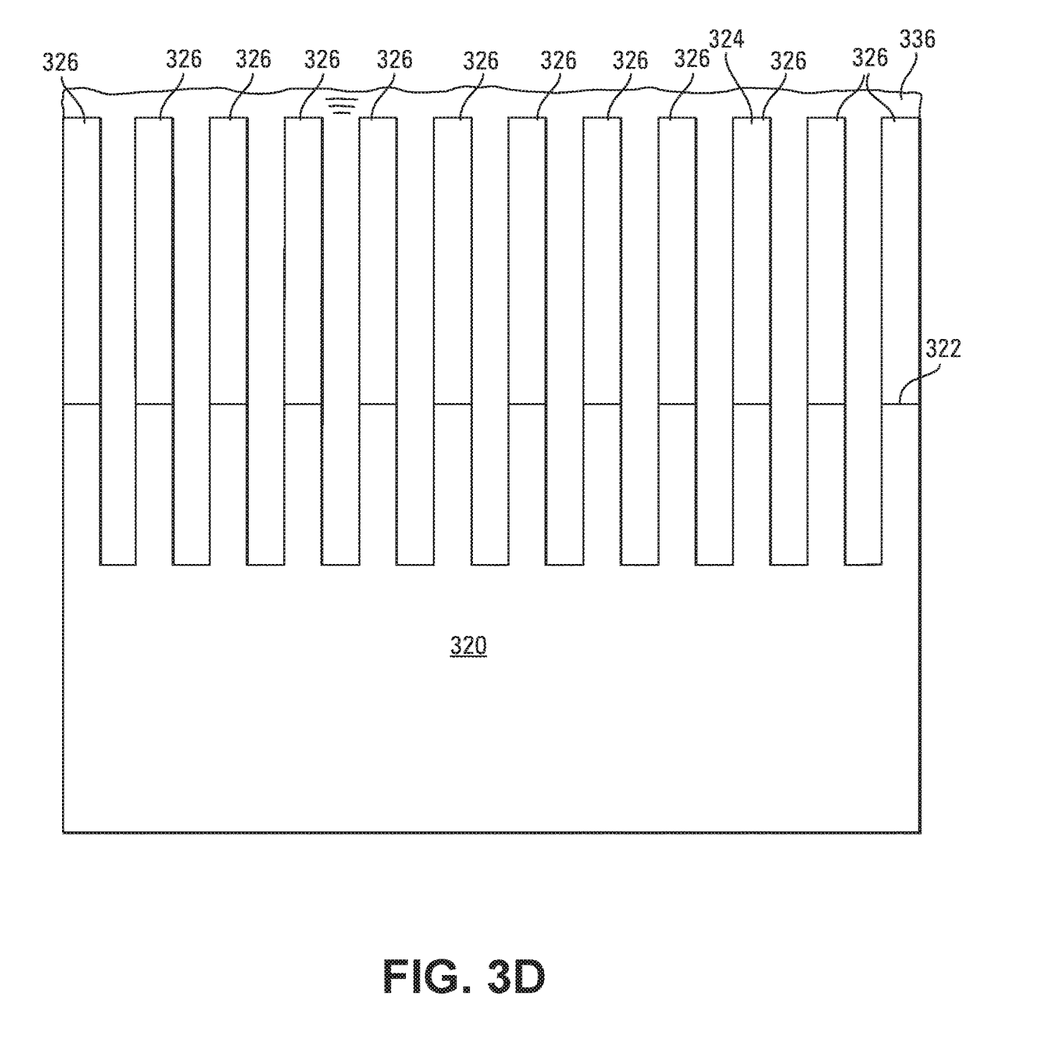

In FIG. 3D, the solvent 334 in FIG. 3C is completely displaced by a liquid polymer solution 336. For example, polymer solution 336 may be deposited in openings 328 so that openings are overfilled with polymer solution 336 while preventing any drying of the structure from occurring, such as while maintaining the structure in a fully wetted state. For example, the transition between depositing the solvent 334 and polymer solution 336 may occur continuously without any breaks between the flow of solvent 334 and the flow polymer solution 336 so as to avoid any drying, and thus avoiding any drying-induced toppling of features 326. For example, polymer solution 336 may be spin coated onto the structure while the structure is spinning.

In some examples, polymer solution 336 may include a polymer resin, such as polymethylmethacrylate, polymethacrylate, polyhydroxystyrene, among others, dissolved in a solvent, such as propylene glycol monomethyl ether acetate, isopropanol, among others. In some examples, solvent 334 is miscible in polymer solution 336, such as in the solvent of polymer solution 336. For example, at least some of solvent 334 may be dissolved in the solvent of polymer solution 336 as polymer solution 336 is being deposited.

The structure of FIG. 3D may be subsequently baked to form the sacrificial polymer material 340 (e.g., a polymer matrix) in FIG. 3E. For example, sacrificial polymer material 340 overfills openings 328. In some examples, the structure of FIG. 3D is moved to a baking chamber while preventing any drying from occurring, such as by keeping the structure covered with polymer solution 336, as shown in FIG. 3D.

In some examples, the temperature of the baking chamber may be set to a temperature that is less than a decomposition temperature of sacrificial polymer material 340. Baking may continue until the temperature of the structure, and thus sacrificial polymer material 340, is brought to a bake temperature, that, in some examples, may be equal to the temperature of the baking chamber. In some examples, sacrificial polymer material 340 may be a pseudo-solid, such as a gel. In some instances, some solvent may remain in sacrificial polymer material 340 at the end of baking when sacrificial polymer material 340 is at the bake temperature. For example, sacrificial polymer material 340 may include the polymer resin and some of the solvent.

Figure 3E:
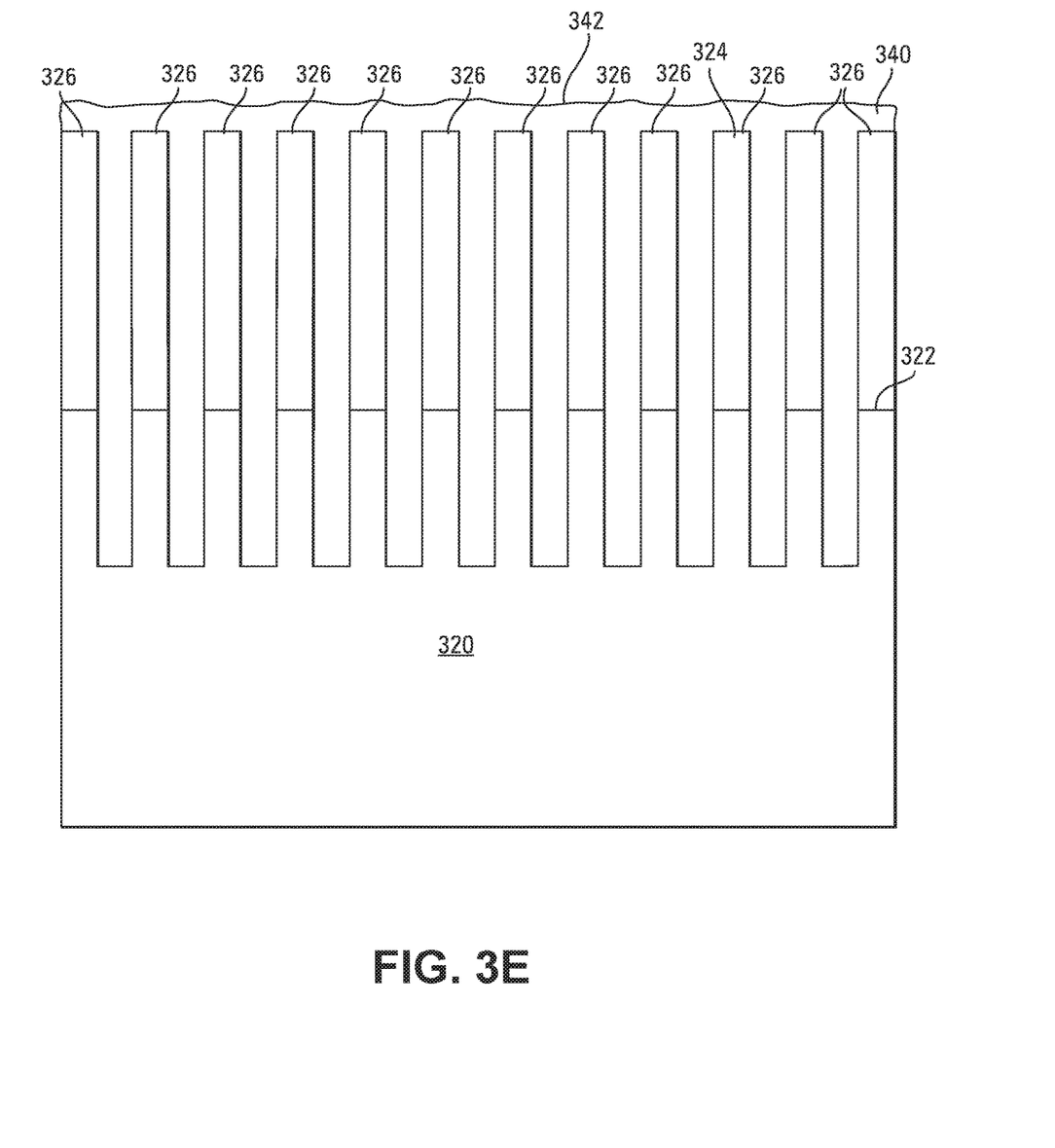
Figure 3F:
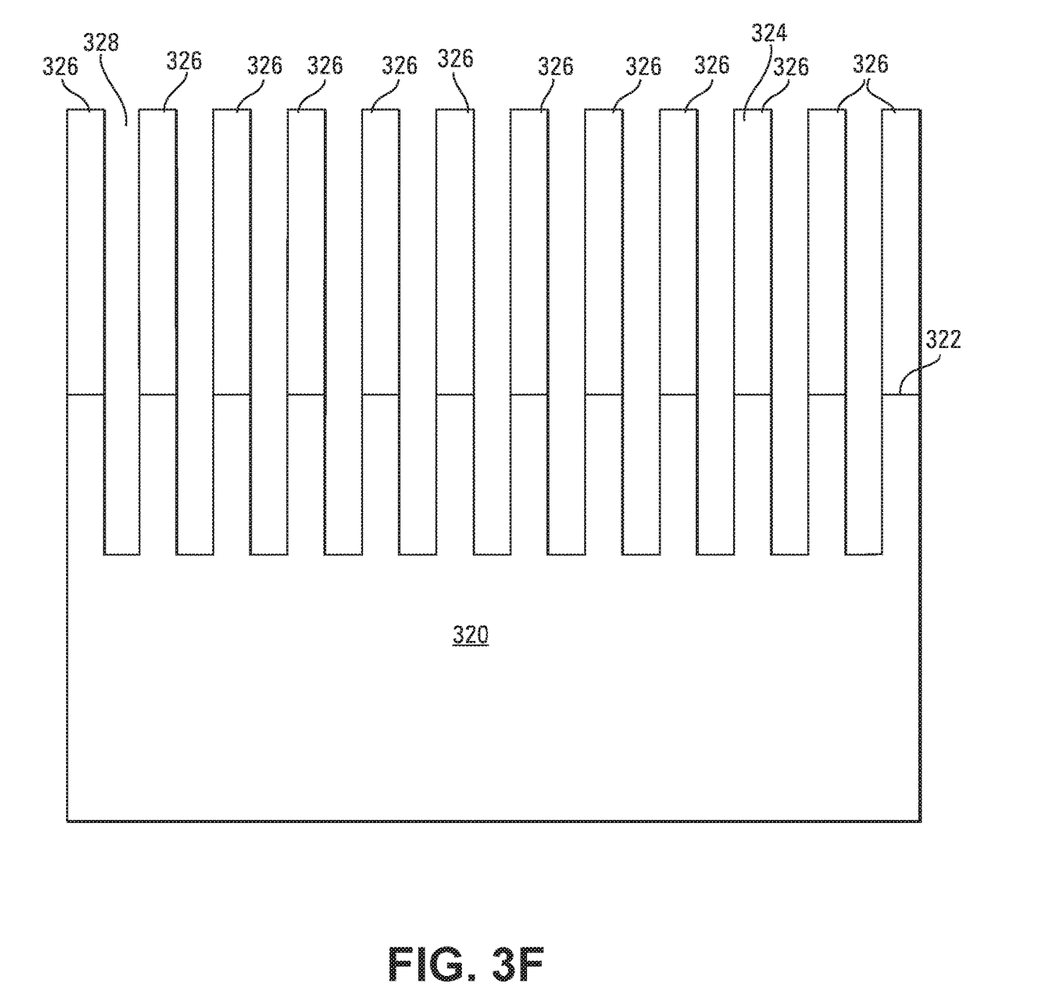

Subsequently, the structure may be moved to a polymer-removal chamber in which sacrificial polymer material 340 is removed to re-expose (e.g., reopen) the openings 328 between features 326, as shown in FIG. 3F. Sacrificial polymer material 340 may be removed using a plasma process, such as a plasma ashing process (e.g., a plasma stripping process). For example, sacrificial polymer material 340 is completely removed in FIG. 3F. Note that the structure in FIG. 3F is completely cleaned as a result of the wet cleaning process, and is ready for subsequent processing. For example, the processing steps of displacing DI water 332 with solvent 334 in FIG. 3C, displacing solvent 334 with polymer solution 336 in FIG. 3D, baking polymer solution 336 to form sacrificial polymer material 340 in FIG. 3E, and removing sacrificial polymer material 340 in FIG. 3F, does not introduce any additional contaminants and prevents any drying-induced toppling of features 326.

In some examples, a difference between the temperature of the sacrificial polymer material 340 at the end of baking (e.g., the bake temperature) and the temperature of the sacrificial polymer material 340 while removing sacrificial polymer material 340 (e.g., the removal temperature) may act to prevent features 326 from toppling (e.g., into each other) during the removal process. For example, the removal temperature may be set to a temperature so that such a temperature difference is attained. For example, the temperature of a chuck of a tool that holds the structure, such as the chuck of an ash tool, may be modified to change the temperature of the structure of FIG. 3E to the removal temperature. Sacrificial polymer material 340 may then be removed while the temperature of the structure of FIG. 3E is at the removal temperature.

In some situations, if the removal temperature is much greater than (e.g., greater than about 50° C.) the bake temperature, features 326 may topple during the removal. For example, bubbles may form in polymer material 340 (e.g., adjacent to substrate 320), resulting in the toppling of features 326. For instance, toppling may occur if the bake temperature is at a temperature recommended by the polymer manufacturer for baking and the removal temperature is at temperature typically recommended for ashing.

In some examples, the temperature difference between the bake temperature and the removal temperature necessary to reduce (e.g., prevent) toppling (e.g., bubbling) during the removal of sacrificial polymer material 340 is having the removal temperature being less than about 50° C. above the bake temperature, the removal temperature being 0° C. to 30° C. above the bake temperature, the removal temperature being less than the bake temperature, and the removal temperature being up to about 100° C. less than the bake temperature.

In some examples, sacrificial polymer material 340 may be removed continuously, starting from an exposed surface of sacrificial polymer material 340 (e.g., upper surface 342 of sacrificial polymer material 340) and continuing (e.g., downward) into the structure of FIG. 3E. For example, sacrificial polymer material 340 may be removed using a continuous top-down process until sacrificial polymer material 340 is completely removed and openings 328 are re-exposed, as shown in FIG. 3F.

In an example, for aspect ratios greater than 22:1, the semiconductor process previously described in conjunction with FIGS. 3A-3F was found to have an average of less than about 0.00015 toppling defects/square micron compared to an average of about 1.3 toppling defects/square micron for previous approaches in which surfaces of the features were treated to reduce capillary forces.

Figure 3G:
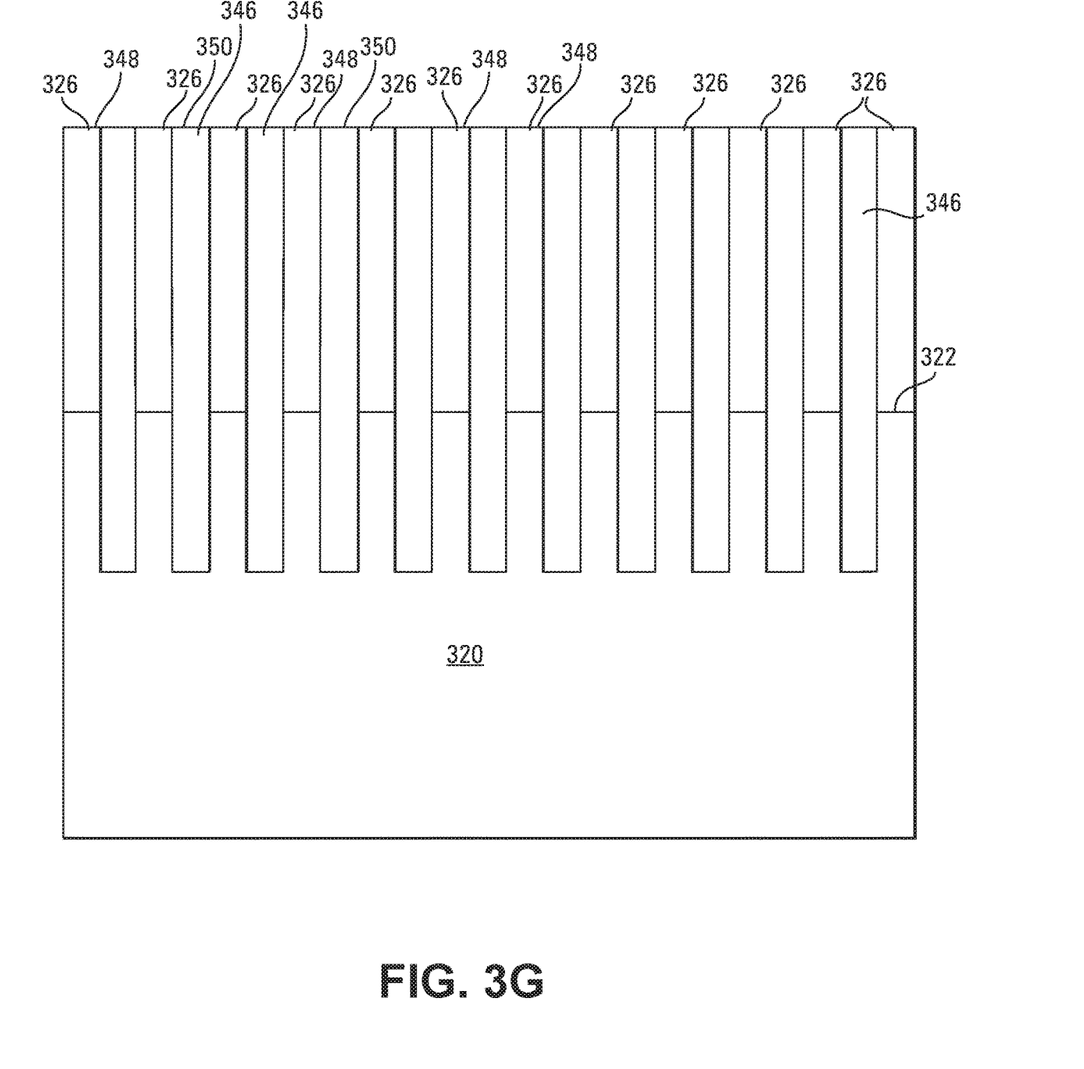

In some examples, as shown in FIG. 3G, a material 346 may be formed in the openings 328 in the structure of FIG. 3F (e.g., in a deposition chamber). For example, material 346 may be formed in a gaseous phase or a plasma phase, such as by PVD, CVD, ALD, among others. For example, material 346 might be an epitaxial silicon material or a dielectric material, such as silicon oxide or silicon nitride. In some examples, material 346 may overfill openings 328 and extend over the upper surfaces 348 of features 326. Subsequently, a portion of material 348 may be removed, such as by chemical mechanical planarization (CMP) so that upper surfaces 350 of material 346 are coplanar with upper surfaces 348, as shown in FIG. 3G.

In some examples, portions below surface 322 may be isolation regions. In examples in which features 326 may be comprised entirely of substrate 320, rather than a subsequently deposited material as previously described in conjunction with FIG. 3A, and the regions between features 326 containing material 346 may be isolation regions.

Figure 4:
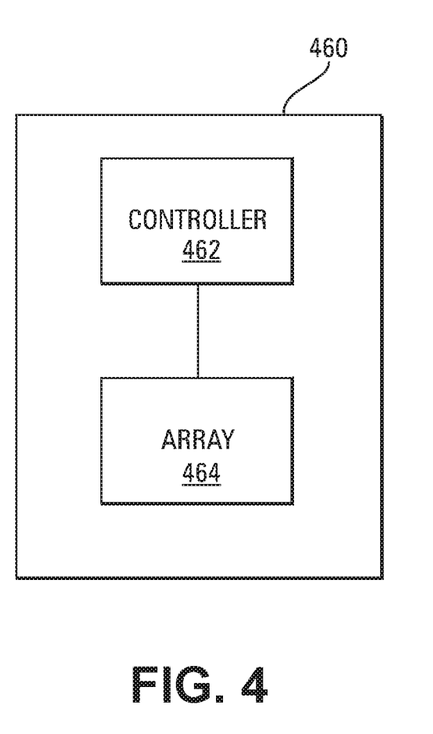
FIG. 4 is a block diagram illustration of an apparatus formed, at least in part, in accordance with a number of embodiments of the present disclosure.

FIG. 4 is a block diagram of an apparatus, such as a memory device 460. For example, memory device 460 may be a volatile memory device, such as a DRAM, a non-volatile memory device, such as NAND flash or NOR flash, among others. For example, memory device 460 may be formed, at least in part, using the processing previously described, such as in conjunction with FIGS. 3A-3G.

Memory device 460 includes a controller 462, such as an application specific integrated circuit (ASIC), coupled to a memory array 464, such as a DRAM array, a NAND array, a NOR array, among others. For example, memory array 464 might be formed, at least in part, according to the processing described previously.

The controller 462 can control the operations on the memory device 460, and of the memory array 464, including data sensing (e.g., reading) and data programming (e.g., writing), for example. Memory device 460 may be coupled to a host device (not shown in FIG. 4).

Embodiments of the disclosure use sacrificial polymer materials to close openings in structures (e.g., to be used in semiconductor devices, such as integrated circuits, memory devices, MEMS, and the like), such as between features in the structures, during wet processing without allowing any drying to occur. This acts to prevent drying-induced toppling of the features that occurs in previous approaches.

Although specific examples have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A semiconductor processing method, comprising:
depositing a solvent in openings between features of a structure while preventing drying of the structure;
displacing the solvent with a polymer solution while preventing drying of the structure;
forming a polymer material by heating the structure to a first temperature; and
removing the polymer material by heating the structure to a second temperature.

2. The method of claim 1, further comprising depositing the polymer solution in the openings such that the openings are over filled with the polymer solution.

3. The method of claim 1, further comprising, prior to depositing the solvent, performing a wet cleaning process to clean the structure while preventing drying of the structure.

4. The method of claim 3, further comprising displacing liquid in the openings from the wet cleaning process with the polymer solution.

5. The method of claim 1, wherein the second temperature is no more than 50° C. higher the first temperature.

6. The method of claim 1, wherein the second temperature is lower than the first temperature.

7. The method of claim 1, wherein forming the polymer material in the openings prevents the features of the structure from toppling.

8. A semiconductor processing method, comprising:
displacing a first solvent in openings between features of a structure with a polymer solution comprising a second solvent and a polymer resin;
baking the structure to a first temperature to form a polymer material in the openings; and
baking the structure to a second temperature to remove the polymer material from the openings.

9. The method of claim 8, wherein the first temperature is higher than the second temperature.

10. The method of claim 9, wherein the first temperature is at most approximately 100° C. higher than the second temperature.

11. The method of claim 8, wherein the second temperature is less than approximately 50° C. higher than the first temperature.

12. The method of claim 8, wherein the second temperature is approximately 0° C. to approximately 30° C. higher than the first temperature.

13. The method of claim 9, wherein a difference between the first and second temperatures reduces bubbling of the sacrificial polymer material while the sacrificial polymer material is being removed from the opening.

14. A semiconductor processing method, comprising:
performing a wet cleaning process on openings between a plurality of features of a structure;
displacing liquid in the openings from the wet cleaning process with a first solvent;

displacing the solvent with a polymer solution comprising a second solvent and a polymer resin;

baking the structure to form a sacrificial polymer material within the openings; and removing the sacrificial polymer material from the structure.

15. The method of claim 14, wherein removing the sacrificial polymer material comprises using a plasma ashing process.

16. The method of claim 15, wherein removing the sacrificial polymer material comprises using the plasma ashing process until the sacrificial polymer material is completely removed.

17. The method of claim 14, wherein displacing the solvent in the openings with the polymer solution comprises dissolving at least some of the solvent in the polymer solution.

18. The method of claim 14, wherein baking the structure comprises baking the structure until the polymer solution is at a first temperature, and wherein the method further comprises removing the sacrificial polymer material while the structure and the sacrificial polymer material are at a second temperature.

19. The method of claim 18, wherein the first temperature is higher than the second temperature.

20. The method of claim 18, wherein a difference between the first and second temperatures prevents the features from toppling while removing the sacrificial polymer material from the openings.

* * * * *